US011100013B2

(12) United States Patent
Keil

(10) Patent No.: US 11,100,013 B2
(45) Date of Patent: Aug. 24, 2021

(54) SCHEDULING OF READ AND WRITE MEMORY ACCESS REQUESTS

(71) Applicant: Apple Inc., Cupertino, CA (US)

(72) Inventor: Shane J. Keil, San Jose, CA (US)

(73) Assignee: Apple Inc., Cupertino, CA (US)

(*) Notice: Subject to any disclaimer, the term of this patent is extended or adjusted under 35 U.S.C. 154(b) by 137 days.

(21) Appl. No.: 16/058,647

(22) Filed: Aug. 8, 2018

(65) Prior Publication Data

US 2020/0050396 A1 Feb. 13, 2020

(51) Int. Cl.
| | | |
|---|---|---|
| *G06F 3/06* | (2006.01) | |
| *G06F 13/16* | (2006.01) | |
| *G11C 11/406* | (2006.01) | |
| G06F 9/30 | (2018.01) | |
| G11C 7/10 | (2006.01) | |
| G11C 7/22 | (2006.01) | |

(52) U.S. Cl.
CPC ...... *G06F 13/1636* (2013.01); *G06F 13/1621* (2013.01); *G06F 13/1642* (2013.01); *G06F 13/1689* (2013.01); *G11C 11/406* (2013.01); *G11C 11/40607* (2013.01); *G06F 9/3004* (2013.01); *G06F 13/1626* (2013.01); *G11C 7/1048* (2013.01); *G11C 7/22* (2013.01)

(58) Field of Classification Search
CPC ..... G11C 16/0483; G11C 16/26; G11C 16/10; G11C 11/5642; G11C 16/32; G11C 11/4072; G11C 11/4091; G11C 13/0061; G11C 2207/2281; G11C 11/2293; G11C 11/4076; G06F 13/1689; G06F 13/1673; G06F 13/1621; G06F 13/1642; G06F 13/1668

See application file for complete search history.

(56) References Cited

U.S. PATENT DOCUMENTS

| | | | |
|---|---|---|---|
| 6,704,821 B2 | 3/2004 | Scandurra et al. | |
| 7,127,573 B1 | 10/2006 | Strongin et al. | |
| 9,916,105 B1 | 3/2018 | Asnaashari | |
| 2005/0047239 A1* | 3/2005 | Takahashi | G11C 11/406 365/222 |
| 2005/0091460 A1 | 4/2005 | Rotithor et al. | |
| 2010/0122062 A1 | 5/2010 | Hummel et al. | |
| 2017/0060788 A1* | 3/2017 | Chang | G06F 13/4068 |

OTHER PUBLICATIONS

Nima Honarmand, Main Memory and DRAM, 2015, Stony Brook University, 1-37. (Year: 2015).*
Kaseridis et al., Minimalist Open-page A DRAM Page-mode Scheduling Policy for the Many-core Era, Dec. 7, 2011, AMC 978-01-4503-1053-6/11/12, 1-12 (Year: 2011).*

* cited by examiner

*Primary Examiner* — Reginald G Bragdon
*Assistant Examiner* — Thanh D Vo
(74) *Attorney, Agent, or Firm* — Kowert, Hood, Munyon, Rankin & Goetzel, P.C.

(57) ABSTRACT

A memory system includes a memory circuit including a plurality of pages, including a particular page having a page activation time. The memory system also includes a memory controller circuit configured to receive a memory access request corresponding to data of the particular page. The memory controller circuit is also configured to transmit, in response to a determination that the particular page is inactive, an activation command to the memory circuit to activate the particular page, and to schedule a future transmission of an initial memory command for the particular page based on the page activation time.

20 Claims, 12 Drawing Sheets

SCHEDULING OF READ AND WRITE MEMORY ACCESS REQUESTS

BACKGROUND

Technical Field

Embodiments described herein are related to the field of computing systems, and more particularly to the management of memory requests by a memory controller in a computing system.

Description of the Related Art

Computer systems, including systems-on-a-chip (SoCs), include processors and multiple memory circuits that store software programs or applications, as well as data being operated on by the processors. Such memories may vary in storage capacity as well as access time. In some computing systems, some memory circuits coupled to the processors via a memory controller circuit communicating with the processors via a communication link or other communication network.

During operation, the processors, which may include processor cores, graphics processors, and the like, transmit requests for access to the memory controller via the communication link. The memory controller receives the requests and arbitrates access to the memory circuits for the requests. Upon relaying a particular request from a processor to the memory circuits, the memory controller circuit waits until the memory circuit fulfills the particular request. In order to fulfill the particular request, the memory circuit may send requested data or an acknowledgement signal to the memory controller circuit, which, in turn, relays the data or signal onto the requesting processor.

SUMMARY

Broadly speaking, a system, an apparatus, and a method are contemplated in which the apparatus includes a memory circuit including a plurality of pages, including a particular page having a page activation time. The apparatus also includes a memory controller circuit configured to receive a memory access request corresponding to data of the particular page. The memory controller circuit may also be configured to transmit, in response to a determination that the particular page is inactive, an activation command to the memory circuit to activate the particular page, and to schedule a future transmission of an initial memory command for the particular page based on the page activation time.

In some implementations, the initial memory command is an initial read command. The memory controller circuit may be configured to schedule the initial read command to minimize a delay between when the particular page activates in response to the activation command and when the particular page receives the initial read command.

In particular implementations, the memory access request may be a read command, and the memory controller circuit may be further configured to schedule one or more other read commands for different portions of the data within the particular page. The memory controller circuit may also be configured to include, with a final read command for the particular page, an indication to perform a pre-charge operation to close the particular page.

In various embodiments, a memory access request corresponding to data of a given page may be received within an elapsed time since the given page was refreshed. The memory controller circuit may be configured to, in place of a previously scheduled refresh command, schedule transmission of an activation command for the given page of the memory circuit based on the elapsed time.

In particular implementations, the memory access request may be a write request that includes a read operation followed by a write operation, wherein the read operation includes an initial read command. The memory controller circuit may be configured to schedule the initial read command to reduce a delay between when the particular page activates in response to the activation command and when the particular page receives the initial read command.

In some embodiments, to schedule the future transmission of the initial memory command for the particular page based on the page activation time, the memory controller circuit may be configured to, based on the page activation time, place the initial memory command into a command buffer, wherein a placement of the initial memory command within the command buffer determines when the initial memory command is sent to the memory circuit.

In various implementations, the memory circuit may be a dynamic random-access memory (DRAM) circuit. The page activation time may include an amount of time for the DRAM circuit to copy data from memory cells to a page buffer.

BRIEF DESCRIPTION OF THE DRAWINGS

The following detailed description makes reference to the accompanying drawings, which are now briefly described.

Figure 1:
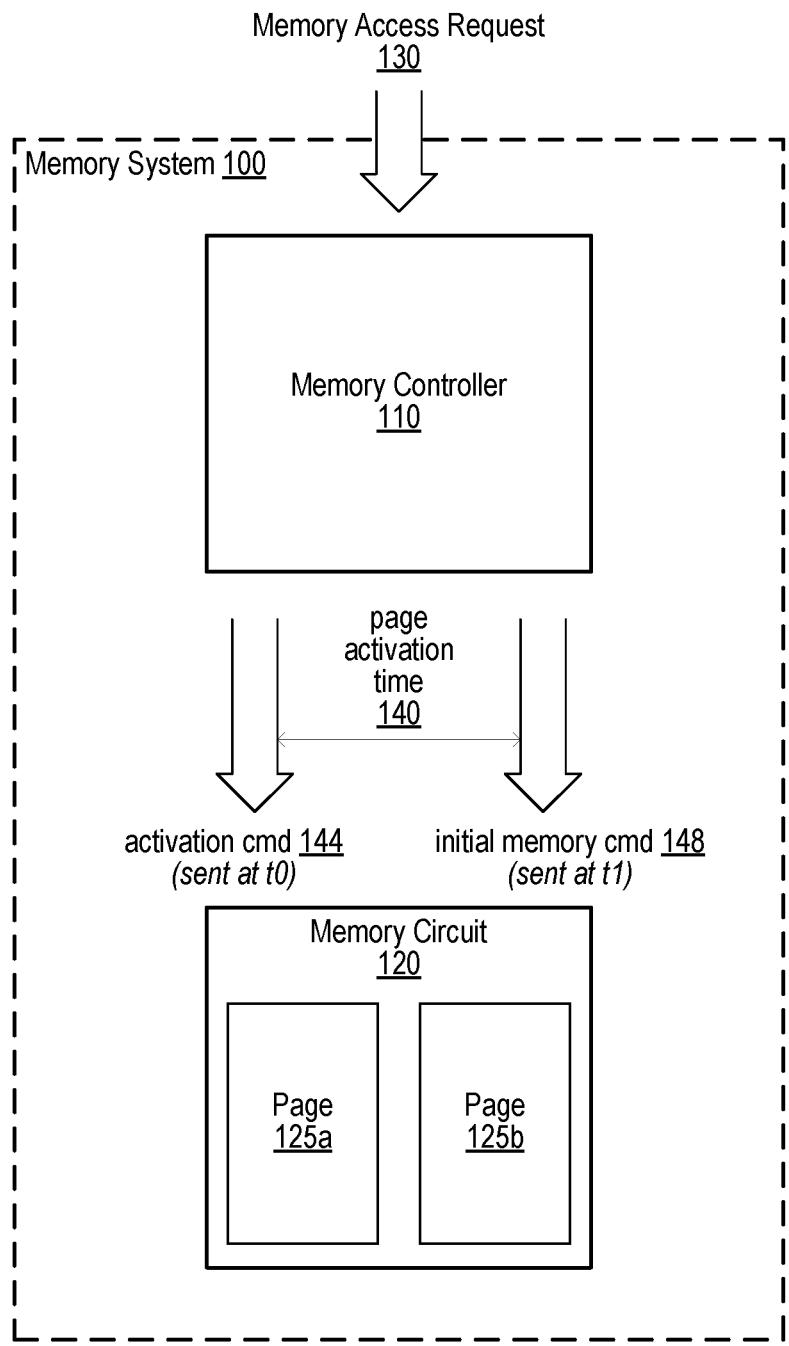
FIG. 1 illustrates a block diagram of an embodiment of a memory system, including a memory controller circuit and a memory circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

In a computer system, a hierarchy of memory circuits are used to store program instructions and data for use by functional circuit blocks within the computer system. Such functional circuit blocks may include processors, processor cores, graphics cores, audio processing circuit, network processing circuits, and the like. Some of the memory circuits, such as cache memory circuits, may be directly coupled to functional circuit blocks in order to provide low-density fast-access dedicated storage for the functional blocks. Other memory circuits are shared between multiple functional circuit blocks to allow the functional circuit blocks access to larger amounts of storage space. To facilitate such sharing of memory circuits, a memory controller circuit may be employed to manage access to the memory circuits.

A memory controller circuit receives requests to access the memory circuits from the functional circuit blocks. Such requests can include requests to retrieve previously stored data from the memory circuits (commonly referred to as "read requests") and requests to stored data in the memory circuits (commonly referred to as "write requests"). In some cases, a read request and a write request may be combined to form a "read-modify-write" request. One example of a read-modify-write request is a "mask write request" in which a portion of data located at a designated address in the memory circuits is written based on the request, while the remaining portion of the data is unaltered.

As the memory controller circuit receives memory requests to access data the memory circuit, each request is placed in a command buffer in an execution order relative to other received requests in a process referred to as scheduling. A received memory request may correspond to a particular page in the memory circuit. After determining that the particular page is inactive, the memory controller sends an activation command to the memory circuit to activate the particular page. The memory circuit may have an associated page activation time from receiving the activation command to when data from the particular page can be accessed. The memory controller schedules a memory command to access the particular page based on the activation time.

Inefficient use of memory circuits in a computer system can adversely affect the performance and/or power consumption of a computer system. For example, activating a memory page for access and leaving the page active consumes power. The memory controller, therefore, may schedule memory commands that access a same memory page to be executed in a manner that reduces an amount of time that the same memory page is active. The embodiments illustrated in the drawings and described below may provide techniques for scheduling memory access requests to reduce power consumption and improve computer system performance.

A block diagram for an embodiment of a memory system, including a memory controller circuit and a memory circuit, is illustrated in FIG. 1. As shown, memory system 100 includes memory controller circuit 110 coupled to memory circuit 120. Memory circuit 120 further includes at least two pages of memory, pages 125a and 125b (collectively, pages 125). In various embodiments, memory controller circuit 110 and memory circuit 120 may be included on a same integrated circuit or may be implemented in separate integrated circuits. Memory controller circuit 110 may be a particular embodiment of a state machine or other sequential logic circuit, and memory circuit 120 may be any suitable type of memory circuit such as dynamic random-access memory (DRAM), static random-access memory (SRAM), and the like.

Memory circuit 120, as shown, includes one or more memory devices, each device including one or more memory pages, including at least pages 125. As used herein, a "memory page," or simply "page," refers to a portion of memory cells that can be concurrently sensed in a single memory device using a single read or write command. In some embodiments, a memory page may correspond to one or more physical rows of memory cells in a memory array. In other embodiments, a memory page may correspond to a different physical or logical organization of memory cells, such as, for example, one or more columns of memory cells, or a number of memory cells that can be addressed with a portion of a memory address value. Each of pages 125 have a characteristic page activation time that corresponds to a time for sensing the memory cells in response to receiving a page activation command. For example, after receiving a page activation command for page 125*a*, data in page 125*a* is not available to be read until the corresponding page activation time has elapsed. In various embodiments, a page activation time may be the same or different between different memory pages or between different memory devices.

It is noted, that as used herein, the term "concurrent" is used to refer to events that may occur during overlapping points in time. The use of "concurrent" is not intended to imply that events begin and end simultaneously, although such occurrences are not ruled out either.

As illustrated, memory controller circuit 110 is configured to receive memory access request 130 to access data stored in a particular one of pages 125 in memory circuit 120. Memory access request 130 may correspond to a request from a processing circuit included, for example, in a computing system that includes or is otherwise coupled to memory system 100. Memory access request 130 includes a request to read and/or write memory cells corresponding to a particular address value or range of address values. To fulfill a memory access request, memory controller circuit 110 may generate one or more memory commands to be sent to memory circuit 120 to fulfill the memory request. Such commands may be placed into a command buffer as part of a scheduling process. After receiving memory access request 130, memory controller circuit 110 schedules one or more memory commands to be issued in the scheduled order to memory circuit 120 for execution.

As illustrated in FIG. 1, memory controller circuit 110 schedules two memory commands to fulfill memory access request 130: activation command (cmd) 144 and initial memory command (cmd) 148. For example, memory access request 130 may access page 125*a*. At the time memory access request 130 is received by memory controller circuit 110, page 125*a* is inactive. In response to determining that page 125*a* is inactive, memory controller circuit 110 sends activation command 144 to memory circuit 120 to activate page 125*a*. Memory controller circuit 110 further schedules a future transmission of initial memory command 148 for page 125*a* based on page activation time 140. Based on page activation time 140, memory controller circuit 110 places initial memory command 148 into a command buffer to access the particular page. The placement of initial memory command 148 within the command buffer determines when, with respect to activation command 144, initial memory command 148 is sent to memory circuit 120. For example, in some embodiments, memory controller circuit 110 may receive an instruction clock signal with a five nanosecond (ns) period. If page activation time 140 is 20 ns, then memory controller circuit 110 may schedule initial memory command 148 to be sent to memory circuit 120 after four cycles of the instruction clock signal occur from the time activation command 144 is sent. By scheduling initial memory command 148 based on page activation time 140, an amount of time between page 125*a* becoming active and then being accessed may be reduced, thereby reducing an amount of power consumed for keeping page 125*a* active.

It is noted that memory system 100 as illustrated in FIG. 1 is merely an example. The illustration of FIG. 1 has been simplified to highlight features relevant to this disclosure. In other embodiments, memory system 100 may include, for example, additional circuit blocks such as interface circuits configured to receive memory requests from processing circuits within a computing system.

As depicted in FIG. 1, memory controller circuit 110 may generate one or more memory commands to fulfill a given memory access requests. Memory controller circuit 110 may then schedule these commands to reduce an amount of time that a memory page is active. Examples of scheduling memory commands are shown in FIGS. 2A and 2B.

Figure 2A:
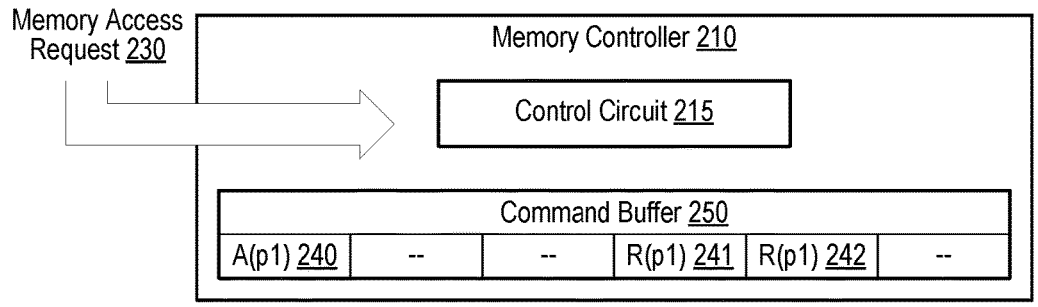
FIG. 2A shows a block diagram of an embodiment of a memory controller circuit and a time line for executing commands issued by the memory controller.
Figure 2A:
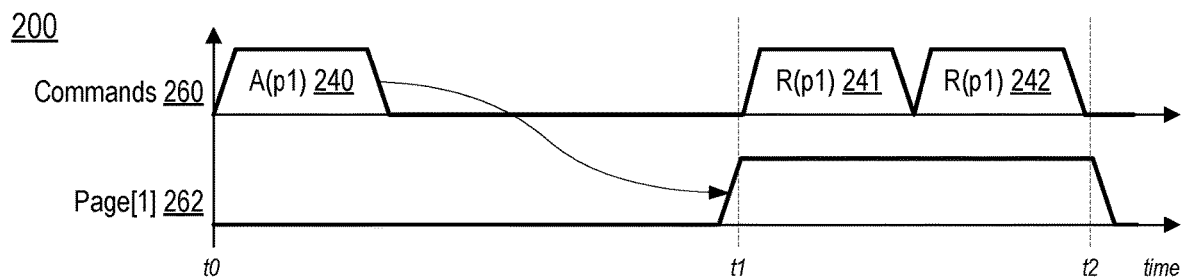
Figure 2B:
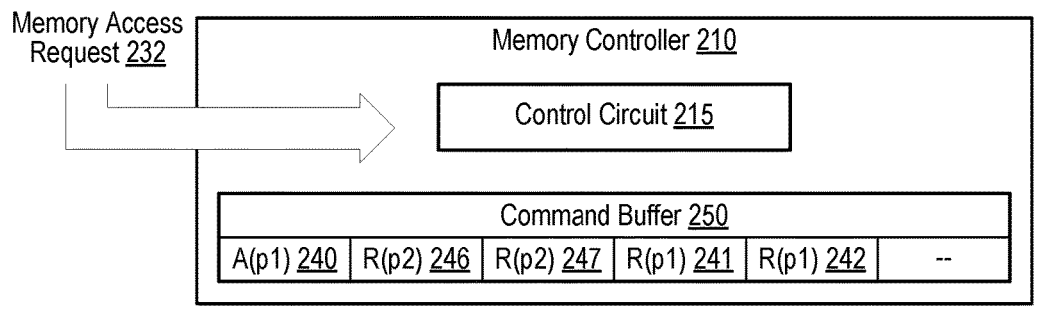
FIG. 2B depicts a block diagram of an embodiment of a memory controller circuit and another time line for executing a different set of commands issued by the memory controller.
Figure 2B:
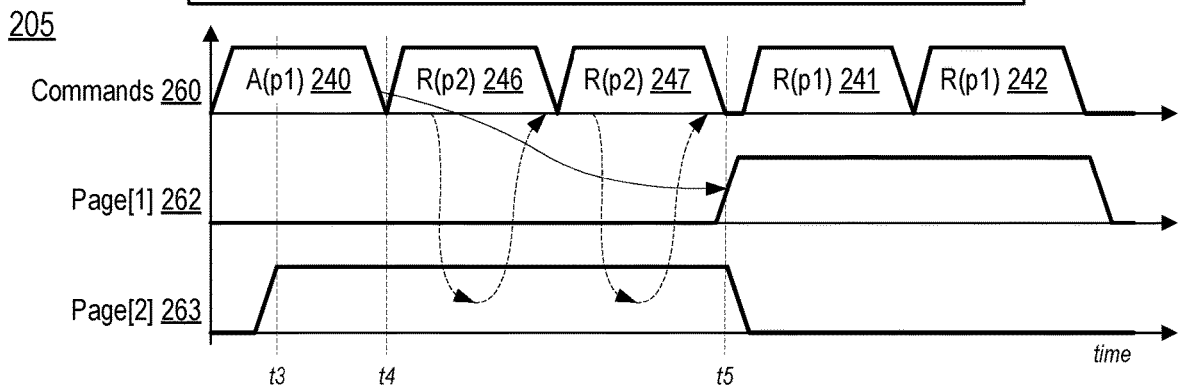

Moving to FIGS. 2A and 2B, an embodiment of a memory controller circuit is shown at two points in time. In addition, a timeline depicting command execution in a memory circuits shown for each of the points in time. In both FIGS. 2A and 2B, memory controller circuit 210 includes control circuit 215, and command buffer 250. Memory controller circuit 210 is a part of a memory system, such as, for example, memory system 100 in FIG. 1. Accordingly, memory controller circuit 210 may, in some embodiments, correspond to memory controller circuit 110 in FIG. 1. Chart 200 in FIG. 2A includes two signals: commands 260 depicts execution of a command in a memory circuit (e.g., memory circuit 120 in FIG. 1), and page[1] 262 depicts readiness of a memory page 1 (e.g. page 125*a*) in the memory circuit. In FIG. 2B, chart 205 includes three signals: commands 260 and page[1] 262, each representing the same information as in chart 200, and page[2] 263 representing readiness of a memory page 2 (e.g. page 125*b*) in the memory circuit.

Memory controller circuit 210, like memory controller circuit 110, includes circuits for receiving, decoding, scheduling, and executing received memory requests. Memory controller circuit 210 receives a memory request to access the memory circuit from a processing circuit included in a computing system that includes memory controller circuit 210. Control circuit 215 receives the memory request and schedules one or more memory commands to fulfill the memory request. In FIG. 2A, memory controller circuit 210 receives memory access request 230 and to fulfill, the received request, control circuit 215 schedules memory commands 240-242 in command buffer 250. In various embodiments, control circuit 215 may be a particular embodiment of a state machine or other sequential logic circuit, and in some embodiments, may correspond to more than one circuit block, such as, for example, an instruction decode circuit and a request arbitration circuit. Command buffer 250 may be a particular embodiment of a register file or other suitable storage circuit configured to store commands 240-242.

Control circuit 215, as shown, decodes memory access request 230 to determine that the memory request is a read request for two different locations in memory page 1. Control circuit 215 further determines that memory page 1 is currently inactive. To activate page 1, control circuit 215 schedules activation command A(p1) 240 in command buffer 250. Control circuit 215 further schedules read commands R(p1) 241 and R(p1) 242 to read locations designated by memory access request 230. Read command R(p1) 241 is an initial read command following activation memory page 1. Control circuit 215 schedules read command R(p1) 241 to minimize a time period between activation of memory page 1 by the activation command A(p1) 240 and page 1 receiving initial read command R(p1) 241. A placement of read command R(p1) 241 within command buffer 250 determines when read command R(p1) 241 is sent to the memory circuit. As depicted, control circuit 215 places read command R(p1) 241 in command buffer 250 such that two entries are maintained between activation command A(p1) 240 and read command R(p1) 241. Since a placement of the commands in command buffer 250 determines when the commands are sent to the memory circuit, this gap in entries results in a time delay between activation command A(p1)

240 and read command R(p1) 241 that is equal to or longer than a page activation time of memory page 1.

As shown by commands 260 in chart 200, activation command A(p1) 240 is received by the memory circuit at time t0 and begins execution. As shown by page[1] 262, memory page 1 is active by time t1, some amount time after receiving and executing activation command A(p1) 240. This amount of time from time t0 to time t1 corresponds to the page activation time for page 1. Read memory command R(p1) 241 is sent by memory controller circuit 210 at time t1, just as memory page 1 is active. Read memory command R(p1) 241 can, therefore, be executed with little to no delay added to the page activation time.

Upon determining that memory access request 230 includes a read request, control circuit 215 may also schedule one or more other read commands for different portions of the data within memory page 1 while page 1 is active. As illustrated, control circuit 215 schedules read command R(p1) 242 to be sent to the memory circuit after memory command R(p1) 241 such that each read command can access memory page 1 while page 1 is active. If there are no further requests to read data from memory page 1, thereby making read command R(p1) 242 a final read command for page 1, control circuit 215 also includes with read command R(p1) 242, an indication to perform a pre-charge operation to close memory page 1. As indicated by page[1] 262, memory page 1 returns to an inactive state after read command R(p1) 242 completes execution.

As illustrated in FIG. 2B, memory controller circuit 210 may fill the gap between activation command A(p1) 240 and read command R(p1) 241 with commands for a different memory page, memory page 2. In various embodiments, memory pages 1 and 2 may be capable of being activated concurrently. For example, the two memory pages may correspond to pages in respective memory blocks on a common memory device or pages belonging to two respective memory devices within the memory circuit.

In the example of FIG. 2B, control circuit 215 has already scheduled memory commands 240-242 to fulfill memory access request 230. Memory controller circuit 210 further receives memory access request 232 which control circuit 215 determines is a read request for memory page 2. As depicted by page[2] 263 in chart 205, memory page 2 becomes active at time t3, during the execution of activation command A(p1) 240 for page 1. Control circuit 215, therefore, schedules memory commands for accessing memory page 2 during the gap between activation command A(p1) 240 and read command R(p1) 241. As shown in FIG. 2B, read commands R(p2) 246 and R(p2) 247 are scheduled in command buffer 250, between commands 240 and 241. While memory page 1 is responding to activation command A(p1) 240, read commands R(p2) 246 and R(p2) 247 are executed on the active memory page 2. The two read commands complete by time t5, just before memory page 1 becomes active. Read command R(p1) 241 may then execute at a same time as shown in chart 200 of FIG. 2A. Read command R(p2) 247 may also be a final command for memory page 2, and therefore may close page 2 after completion.

By scheduling read command R(p1) 241 to be sent to the memory circuit based on the page activation time and the sending of activation command A(p1) 240, memory controller circuit 210 may reduce a power consumed by the memory circuit to keep memory page 1 active by reducing a time between the activation and initial read commands. In addition, by scheduling other commands during a gap between the activation and initial read commands, time that might otherwise be spent waiting for page 1 to activate may be used to fulfill a different memory request, thereby increasing performance of the memory system and may further reduce power consumption by allowing a different memory page to be closed sooner.

It is noted that the embodiment of FIG. 2 is merely an example for demonstrating the disclosed concepts. The relative timing depicted by charts 200 and 205 is scaled for clarity. In other embodiments, the time scale and timing delays between various events may differ. For example, the delay from read command R(p1) 242 completing and page [1] 262 returning to the inactive state may be longer in other embodiments.

In the descriptions of FIGS. 2A and 2B, the memory controller circuit may be able to reduce power consumption and increase memory system performance based on scheduling of memory commands. Another example of a technique that may reduce power and/or increase performance is presented in FIG. 3.

Figure 3:
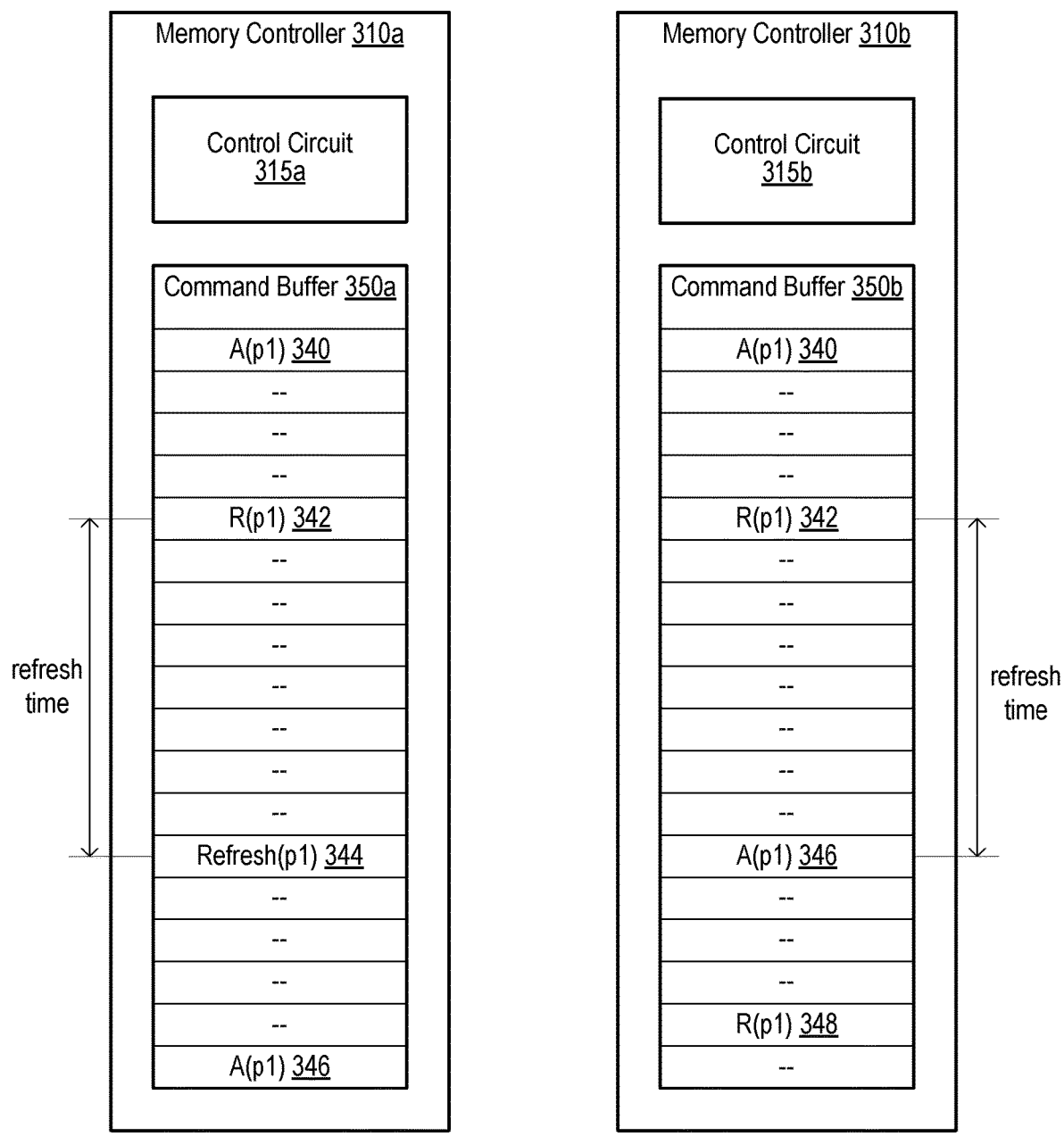
FIG. 3 presents two embodiments of memory controller circuits that each include an arbitration circuit and a command buffer.

Turning to FIG. 3, two embodiments of a memory controller circuit are shown. Memory controller circuits 310a and 310b are each included in respective memory systems, such as memory system 100, for example, and may, therefore, correspond to memory controller circuit 110 in FIG. 1. Each of memory controller circuits 310a and 310b include respective control circuits 315a and 315b and command buffers 350a and 350b.

Command buffer 350a is shown with four scheduled memory commands: activation command A(p1) 340, read command R(p1) 342, refresh (p1) command 344 and activation command A(p1) 346. Commands A(p1) 340 and R(p1) 342 may fulfill a memory request to read data from memory page 1 by activating page 1 and then reading one or more memory locations designated by the request. Refresh (p1) command 344 is used to refresh data stored in memory page 1 before a refresh time expires. Some embodiments of memory circuits, such as, e.g., DRAMs, memory pages are refreshed periodically based on a refresh time specified for the particular memory circuit. This refresh may help to preserve data stored in the memory page. Failing to refresh a memory page within the specified refresh time may result in some data stored in the memory page to be lost. In various embodiments, a command specific for refreshing the memory page may be sent by memory controller circuit 310a to the memory circuit, while in other embodiments, one or more other memory commands may be utilized.

As illustrated, read command R(p1) 342 is a final read command for the active memory page 1, and may, therefore, include a command to close page 1. This closing of page 1 may provide a refresh of the data in page 1 as the page is closed. Control circuit 315a in memory controller circuit 310a schedules refresh (p1) 344 to be sent to the memory circuit before the refresh time elapses for page 1, assuming that there are no further accesses to memory page 1 between commands 342 and 344. Some amount of time after refresh (p1) 344 is sent, another command to activate page 1 (A(p1) 346) is scheduled.

Memory controller circuit 310b, as depicted, schedules transmission of an activation command for memory page 1 in place of a refresh command, based on the elapsed time since the given page was previously refreshed. If a memory access request corresponding to data of memory page 1 is received within the indicated refresh time, then control circuit 315b may replace refresh (p1) 344 used in memory controller circuit 310a with activation command A(p1) 346 to activate page 1. Since activation command A(p1) 346 is scheduled before the refresh time elapses, the activation command refreshes data in memory page 1 in addition to activating page 1 to be accessed. Read command R(p1) 348 may then be scheduled to read data requested by the memory request. It is also noted that a write command to a page that is due for a refresh may be used to replace a refresh command. Since the write command may replace data values in the memory page, the previous data values may not need to be preserved.

By replacing a scheduled refresh command with an activation or other command, power consumption may be reduced and performance may be increased. A refresh command may not provide any functionality other than preserving data stored in a refreshed memory page. Executing a memory command that at least partially fulfills a memory request in place of the refresh command may avoid using instruction cycles on a command with no other benefit as well as reduce a time for fulfilling the associated memory request.

It is noted that the embodiment of FIG. 3 is merely an example. In other embodiments, additional circuit blocks may be included, such as, e.g., an interface to a memory circuit and/or an interface to one or more processing circuits. The illustrated refresh time is scaled for clarity. A refresh time in other embodiments may be a different length.

Referring back to the description of FIG. 2A, the memory controller is disclosed as scheduling an initial read command after a page activation command in order to fulfill a read memory request. Other types of memory request may utilize a similar scheduling technique.

Figure 4:
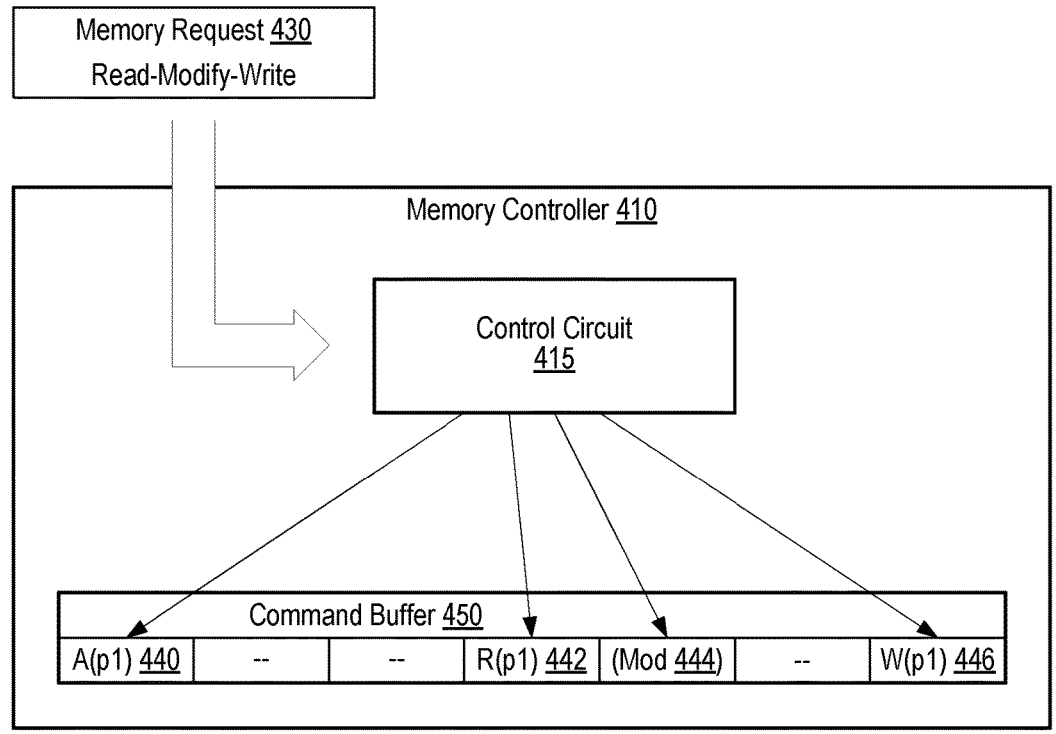
FIG. 4 illustrates an embodiment of a memory controller circuit and a time line for executing another set of commands issued by the memory controller.
Figure 4:
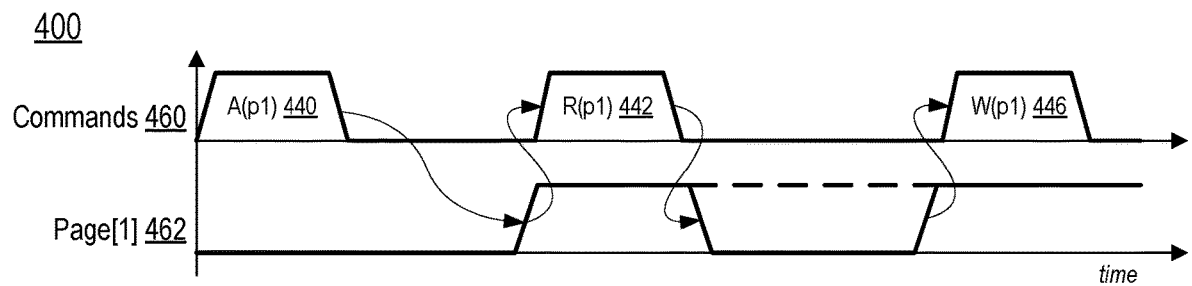

Proceeding to FIG. 4, an embodiment of a memory controller circuit and an associated timeline are presented to illustrate use of the disclosed techniques with a read-modify-write memory request. Memory controller circuit 410 includes control circuit 415 and command buffer 450. Memory controller circuit 410 may correspond to any of the previously disclosed memory controller circuits, such as, for example, memory controller circuits 110 or 210. Chart 400, similar to chart 200 in FIG. 2, depicts a timeline for execution of scheduled memory commands by a memory circuit, such as memory circuit 120 in FIG. 1. Like chart 200, chart 400 includes two signals: commands 460 depicts execution of a command in a memory circuit, and page[1] 462 depicts readiness of a memory page 1 (e.g. page 125*a*) in the memory circuit.

In response to receiving a read request, control circuit 415, as shown, schedules initial read commands for a particular memory page to be sent to a memory circuit after a corresponding page activation command has been sent. Similar to control circuit 215, control circuit 415 schedules the initial read command based on a page activation time associated with the particular memory page. Control circuit 415 may also schedule an initial read command based on the page activation time for other types of memory requests.

As shown, memory controller circuit 410 receives memory request 430, which corresponds to a read-modify-write request. A read-modify-write memory access request is a form of a write command that includes a read operation followed by a write operation. Data from a memory page designated by the request is read, and a portion (or in some cases, all) of the data is replaced by data included in the request. This modified data is then written back into the same location in the memory page. In various embodiments, the data may be read and modified by the memory controller circuit or may be modified within the memory circuit. In the illustrated embodiment, memory controller circuit 410 reads and modifies the data and sends the modified data back to the memory circuit as part of a write command. Since a read-modify-write request includes a read command, the scheduling technique disclosed in regards to FIG. 2A may be utilized.

In response to determining that memory request 430 corresponds to a read-modify-write request for data in page 1 of a memory circuit, control circuit 415 determines if page 1 is active. After determining that page 1 is inactive, as indicated by page[1] 462 in chart 400, control circuit 415 first schedules activation command A(p1) 440. Based on a page activation time for page 1, control circuit 415 schedules initial read command R(p1) 442 to minimize a delay between when page 1 activates in response to activation command A(p1) 440 and when page 1 receives initial read command R(p1) 442. Control circuit 415 further schedules modify operation (mod) 444 and write command W(p1) 446.

After reading the data, memory controller circuit 410 replaces a portion of the read data based on the information received as part of memory request 430. This is performed within memory controller circuit 410 as modify operation 444, and therefore is not sent to the memory circuit (as indicated by the parentheses in command buffer 450). After the data has been modified, memory controller circuit 410 sends write command W(p1) 446 to replace the read data from page 1. By applying the scheduling techniques disclosed above to different types of memory requests, memory controller circuit 410 may be able to further reduce power consumption and/or further increase performance of the memory system.

It is noted that the depictions in FIG. 4 are merely examples. In other embodiments, different numbers of memory requests may be included in the command buffer. The scale and relative timing delays may be different in other embodiments.

Figure 5:
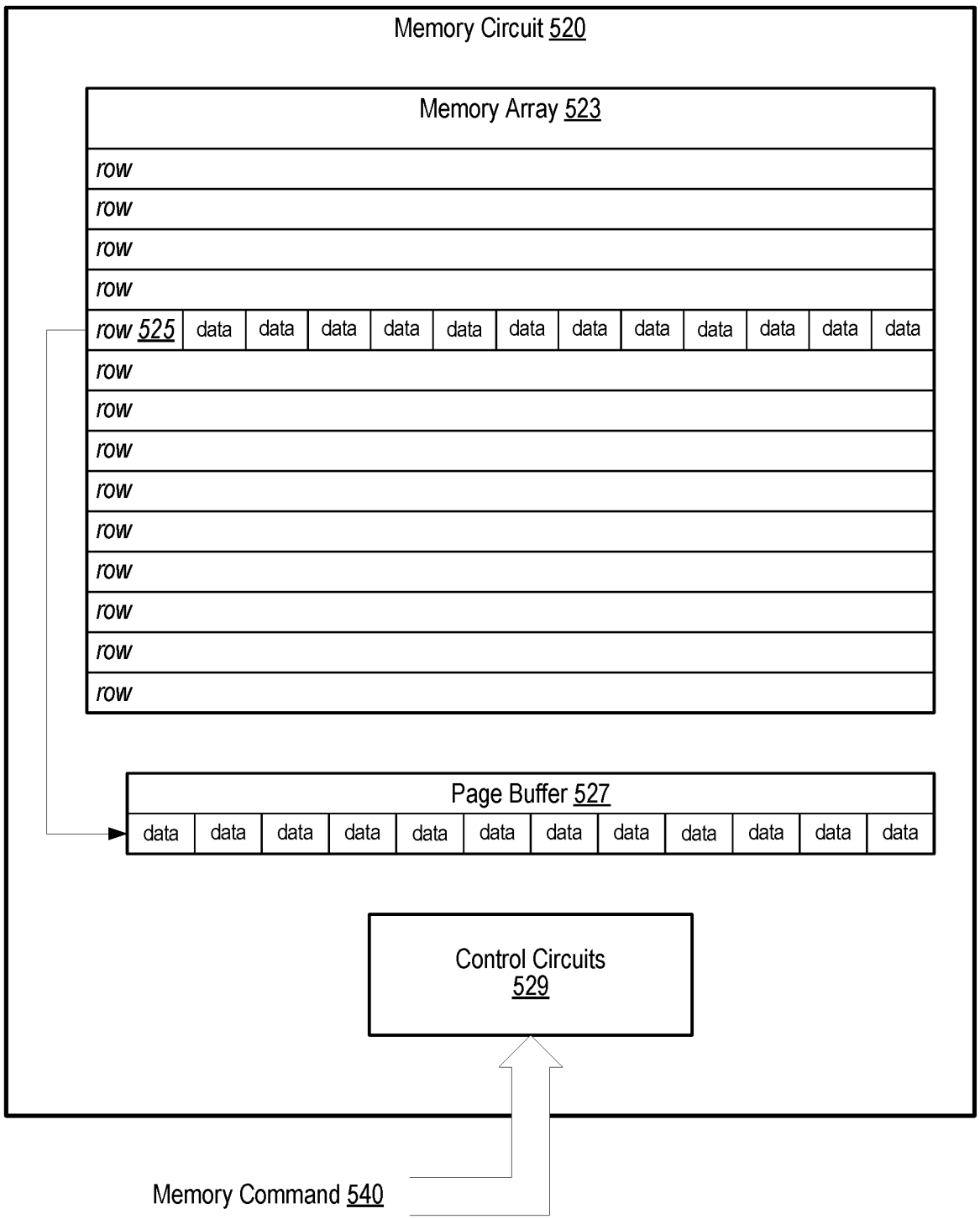
FIG. 5 shows a block diagram of an embodiment of a memory circuit.

Moving now to FIG. 5, an example of a memory circuit is shown. Memory circuit 520 is included as part of a memory system, such as, for example, memory system 100 in FIG. 1. As shown, memory circuit 520 includes memory array 523, page buffer 527, and control circuits 529.

In some embodiments, memory circuit 520 includes one or more of memory array 523. In the illustrated embodiment, memory array 523 is a dynamic random-access memory (DRAM) circuit. Memory circuit 520 receives memory command 540 which is received by control circuits 529. Control circuits 529 may be implemented as one or more state machines or other type of sequential logic circuits. If memory command 540 is a read command, then control circuits 529 determine, based on an address included in memory command 540, a row of memory cells in memory array 523 that include the requested data, in this example, row 525. Control circuits 529 cause data in row 525 to be read and copied into page buffer 527. Page buffer 527, as shown, holds one row of data. In other embodiments, page buffer 527 may hold multiple rows of data at a given time. As illustrated, the amount of data held by page buffer 527 corresponds to a memory page.

A page activation time for a memory page in memory circuit 520 includes an amount of time for memory circuit 520 to copy data from memory cells in row 525 to page buffer 527. After the contents of row 525 are read into page buffer 527, the requested data is sent to a memory controller, such as memory controller circuit 110 in FIG. 1. In some embodiments, a read command may send all contents of page buffer 527 to the memory controller, while in other embodiments, data limited to a range of memory locations specified in memory command 540 may be returned to the memory controller.

If memory command 540 is a write command, then the described process is reversed. Data is received from the memory controller and stored in page buffer 527. After a row of data is stored in page buffer 527, then control circuits 529 cause this data to be stored in memory cells of a selected row, such as, e.g., row 525.

As illustrated, page buffer 527 is used to execute both read and write commands. In other embodiments, however, separate read and write buffers may be utilized. In such embodiments, the read and the write buffers may be not the same size. For example, read buffers may store two or more rows of data while a write buffer may store a single row of data.

It is also noted that FIG. 5 is one example of a memory circuit. In other embodiments, the memory array may include a different number of rows. The memory circuit may include any suitable number of arrays, and each array may include a respective page buffer, thereby allowing for memory pages in different arrays to be accessed concurrently.

Techniques related to scheduling of memory requests based on a page activation time have been presented above. The following descriptions disclose techniques for scheduling memory commands for a particular type of write request.

Figure 6:
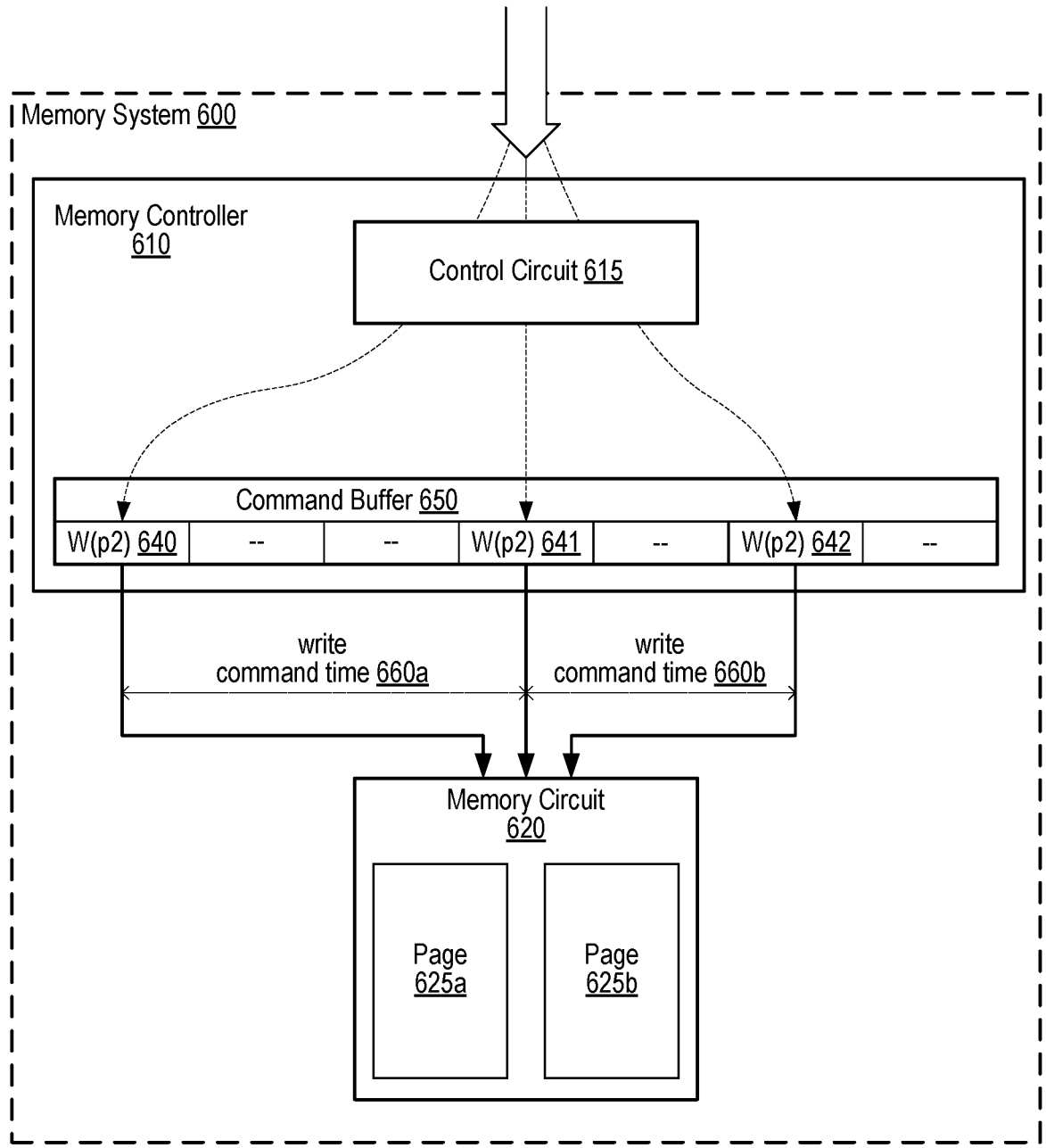
FIG. 6 depicts an embodiment of a flow of a mask write memory request through a memory controller circuit and a memory circuit.

Turning now to FIG. 6, a memory system is illustrated as receiving a mask write memory request. Memory system 600 may, in some embodiments, correspond to memory system 100 in FIG. 1. Memory system 600 includes memory circuit 620 and memory controller circuit 610, which, in turn, includes control circuit 615 and command buffer 650. Memory circuit 620 is illustrated with two memory pages, pages 625a and 625b, or collectively, pages 625.

As illustrated, memory controller circuit 610 and memory circuit 620, and their respective included circuits, correspond to the similarly named and numbered circuits of memory system 100 and, therefore, their respective behaviors are as described above, with exceptions described below.

Memory controller circuit 610 receives mask write request 630 directed to one of pages 625, e.g., page 625b. A mask write request may correspond to a request to write to a portion of data bytes that are stored at one or more locations in a particular memory page. A mask value is included in the mask write request to indicate which data bytes of the stored data are to be rewritten and which data bytes retain their current values. In some embodiments, a mask write command may be limited to a specified mask write size threshold, e.g., one mask write command may be capable of writing to one or more data bytes within a range of 32 bytes. A memory page, however, may be larger than 32 bytes. A mask write request that addresses more than a 32 byte range, therefore, may be implemented by scheduling two or more mask write commands.

Control circuit 615 makes a determination that mask write memory request 630 is a request to write to a portion of page 625b that exceeds this specified mask write size threshold. In response to a determination that the mask write memory request includes more than a specified mask write data size threshold amount of data, control circuit 615 generates a plurality of write commands. Control circuit 615 splits, or divides, mask write memory request 630 into mask write requests W(p2) 640-642, each of which does not exceed the specified mask write size threshold.

Control circuit 615 then determines a respective amount of time for performing each of mask write commands W(p2) 640-642, and then schedules, in command buffer 650, a future transmission of each of mask write commands W(p2) 640-642 based on the respective amounts of time, in order to fulfill mask write memory request 630. As shown in FIG. 6, mask write command W(p2)640 is determined or estimated to take an amount of time corresponding to write command time 660a to complete. Control circuit 615 schedules the subsequent mask write command W(p2) 641 based on write command time 660a. Mask write command W(p2) 641 is expected to take write command time 660b to complete, which in various embodiments, may be more or less time than write command time 660a. As depicted, write command time 660b is a shorter amount of time than write command time 660a. Control circuit 615 schedules mask write command W(p2)642 based on write command time 660b. Memory controller circuit 610 sends mask write commands W(p2) 640-642 to memory circuit 620 based on this scheduled order.

It is noted that FIG. 6 is an example for demonstrating the disclosed concepts. In other embodiments, memory system 600 may include, for example, additional circuit blocks such as interface circuits configured to receive memory requests from processing circuits within a computing system.

Figure 7:
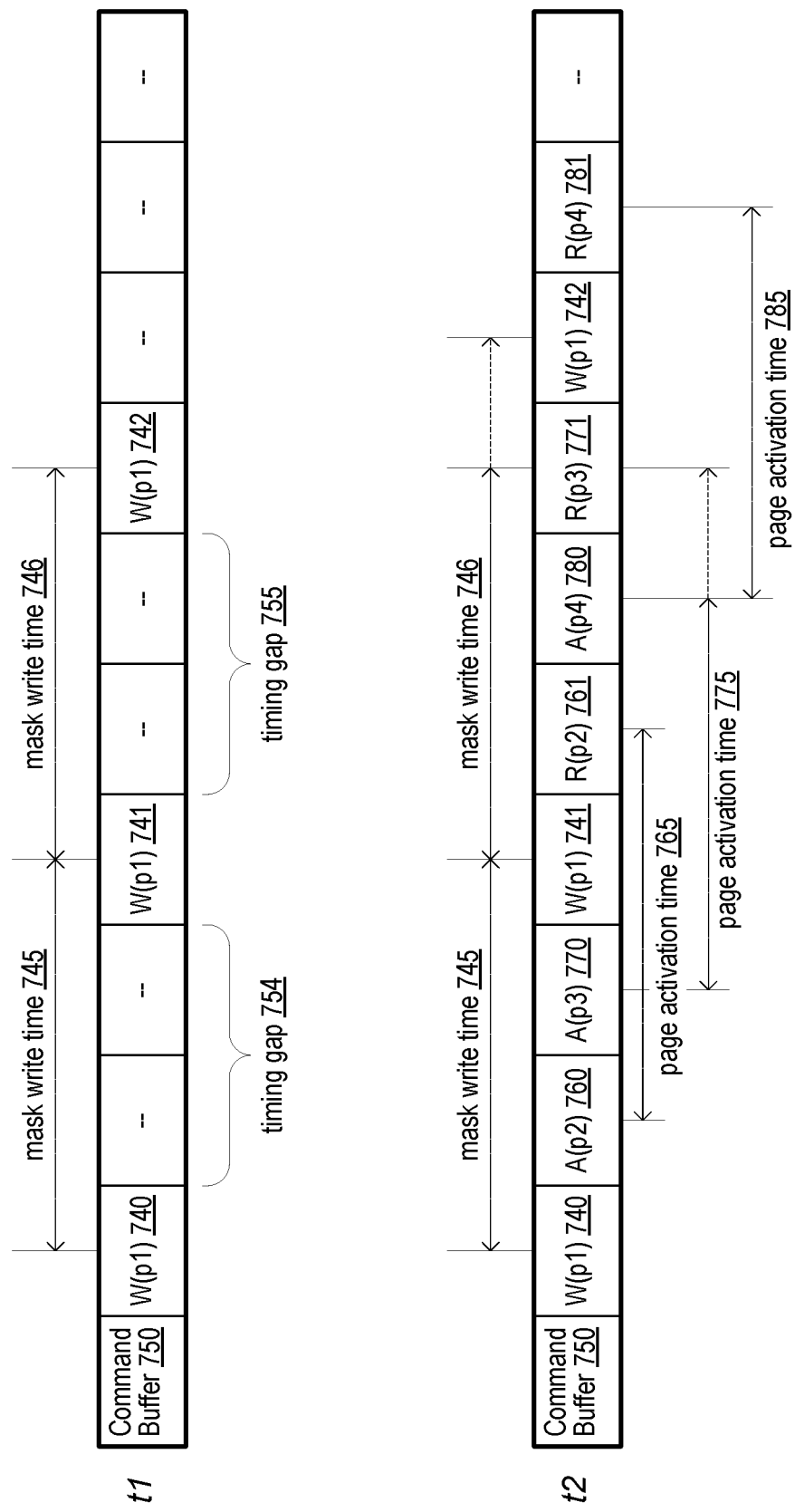
FIG. 7 shows an embodiment of a command buffer at two different points in time.

In some cases, scheduling the individual pieces of a mask write request can result in periods of time (commonly referred to as "gaps") during which no commands to the memory page are scheduled. An embodiment of a command buffer that is capable of utilizing such gaps is illustrated in FIG. 7. As shown, command buffer 750, which may correspond to command buffer 650 as illustrated in FIG. 6, is configured to receive memory commands from a control circuit, such as control circuit 615 in memory controller circuit 610, for example. These received commands may be sent at a later time to memory circuit 620 for execution. Command buffer 750 is shown at a first time t1 and a later time t2.

At time t1, command buffer 750 has received three memory commands, write commands W(p1) 740-742, which in the illustrated example, collectively correspond to a single mask write request directed to memory page 1. As shown, write commands W(p1) 740-742 are scheduled by control circuit 615 based on expected mask write times 745 and 746. This schedule leaves timing gap 754 between commands W(p1) 740 and W(p1) 741, and timing gap 755 between commands W(p1) 741 and W(p1) 742.

Control circuit 615 may schedule other memory access commands to fill these timing gaps between successive ones of write commands W(p1) 740-742. In some cases, control circuit 615 may reorder commands stored in other portions of command buffer 750 (not shown) for transmission to the memory circuit. In other cases, control circuit 615 may receive additional memory requests before write command W(p1) 740 is sent to memory circuit 620. Control circuit 615 arranges the other memory commands between at least two of write commands W(p1) 740-742 to fill the timing gaps.

Command buffer 750 is shown at time t2 with the timing gaps filled by additional commands. Control circuit 615 schedules commands for fulfilling three read memory requests, one each for respective memory pages 2, 3, and 4. As illustrated, memory pages 1-4 may be accessed concurrently. Control circuit 615 determines that memory pages 2-4 are currently inactive. To fill timing gap 754, control circuit 615 schedules activation commands A(p2) 760 and A(p3) 770 to activate memory pages 2 and 3 respectively.

To fill timing gap 755, control circuit 615 may have a plurality of options. Page activation times 765 and 775, corresponding to activation commands A(p2) 760 and A(p3) 770, each elapse during timing gap 755, thereby allowing, in various embodiments, writes, masked writes, and reads, for both memory pages 2 and 3. Additionally, an activation command for page 4 is needed before a masked write or read command for page 4 can be scheduled. In the illustrated example, control circuit 615 schedules read command R(p2) 761 based on page activation time 765 for page 2 and then schedules activation command A(p4) 780 for page 4. At this point, both page activation time 775 and mask write time 746 have elapsed, allowing control circuit 615 to schedule either a read command for page 3 or the last mask write command.

Control circuit 615 may utilize one or more selection criteria to schedule the next command. For example, control circuit 615 may prioritize read commands over write commands, or vice versa. Control circuit 615 may also base the selection on an order in which the memory requests corresponding to the memory commands were received. In the illustrated embodiment, control circuit 615 schedules read command R(p3) 771 next, followed by write command W(p1) 742. At this point, page activation time 785 has elapsed and control circuit 615 may schedule read command R(p4) 781.

By managing an order for scheduling and executing memory commands, occurrences of timing gaps between execution of successive memory commands may be reduced or avoided. In some embodiments, such a reduction of timing gaps may increase an overall performance of a memory system and/or reduce an amount of power consumed by the memory system while executing the commands. It is noted that, as depicted, two memory commands are delayed from an earliest point in time when they may be executed. These delays, however, may allow for an overall increase in system performance when all the scheduled memory commands are considered together.

It is noted that memory command scheduling depicted in FIG. 7 is merely an example of memory command scheduling. In other embodiments, the scheduled order of memory commands may differ. The illustrated command buffer includes ten entries. In other embodiments, the command buffer may include any suitable number of entries.

Figure 8:
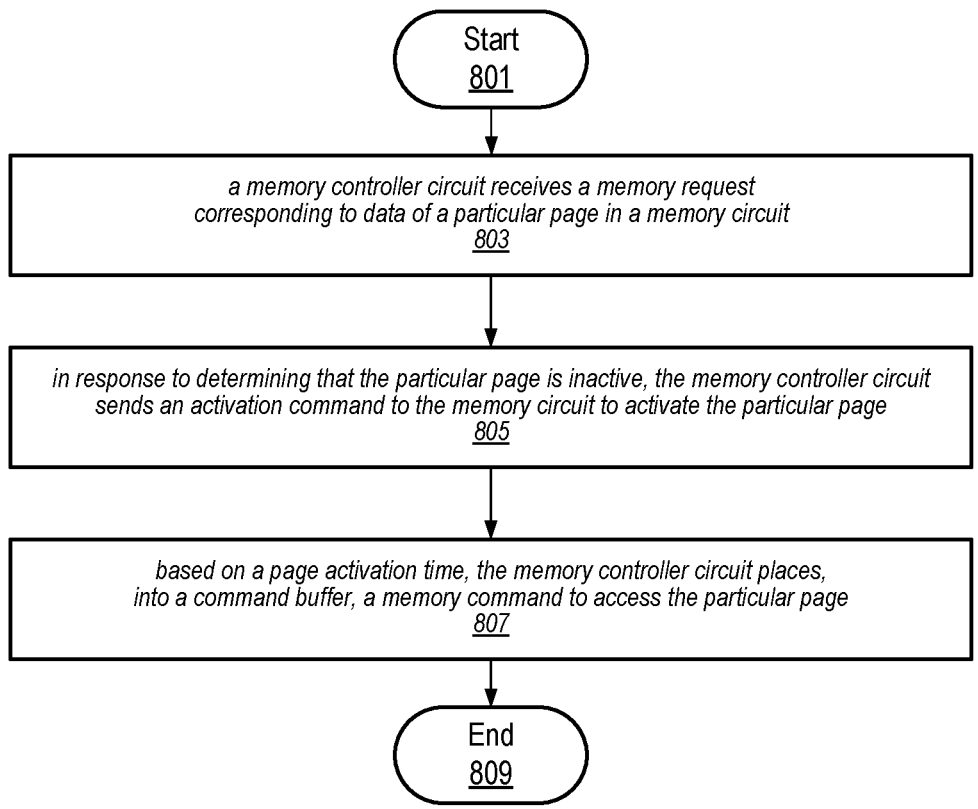
FIG. 8 presents a flow diagram of an embodiment of a method for activating, by a memory controller circuit, a page of a memory circuit in response to receiving a memory request.

Turning to FIG. 8, a flow diagram illustrating an embodiment of a method for scheduling a memory request by a memory controller is shown. Method 800, which may be applied to any of the previously disclosed memory controller circuits, such as, e.g., memory controller circuit 110 in FIG. 1 begins in block 801.

A memory controller circuit receives a memory request corresponding to data of a particular page in a memory circuit (block 803). Memory controller circuit 110, for example, receives memory access request 130 from a processing circuit coupled to memory system 100. Memory access request 130 may correspond to a read request, a write request, or a combination of the two, such as a read-modify-write request. Memory access request 130 includes an address value for identifying a particular location, or a range of locations, in memory circuit 120 to which memory access request 130 is directed. Memory controller circuit 110 may generate one or more memory commands to be executed by memory circuit 120 in order to fulfill memory access request 130.

In response to determining that the particular page is inactive, the memory controller circuit sends an activation command to the memory circuit to activate the particular page (block 805). Using the address value included with memory access request 130, memory controller circuit 110 determines a memory page in memory circuit 120 to which memory access request 130 is directed. For example, page 125a may correspond to the address value. Memory controller circuit 110 determines that page 125a is inactive and, therefore, schedules activation command 144 to activate page 125a.

Based on a page activation time, the memory controller circuit places, into a command buffer, a memory command to access the particular page (block 807). In various types of memory circuits, an amount of time may be required from activating a memory page to when the page is active and may be accessed by an initial memory command. This amount of time corresponds to page activation time 140. In DRAM memory circuits, for example, page activation time 140 may include an amount of time used to decode an address in order to select one or more rows of memory cells sense data stored in the memory cells of the one or more rows, and copy the sensed data into a page buffer. Memory controller circuit 110 schedules initial memory command 148 to be sent to memory circuit 120 after page activation time 140 elapses. Placement of memory commands in the command buffer (e.g., command buffer 250 in FIG. 2) may determine when a particular memory command is sent to the memory circuit. Memory controller circuit 110, therefore, places initial memory command 148 into the command buffer based on page activation time 140. The method ends in block 809.

It is noted that method 800 is one example related to scheduling memory requests for execution. Some embodiments may include additional operations, such as, for example, determining what memory commands are generated to fulfill the received memory request.

Figure 9:
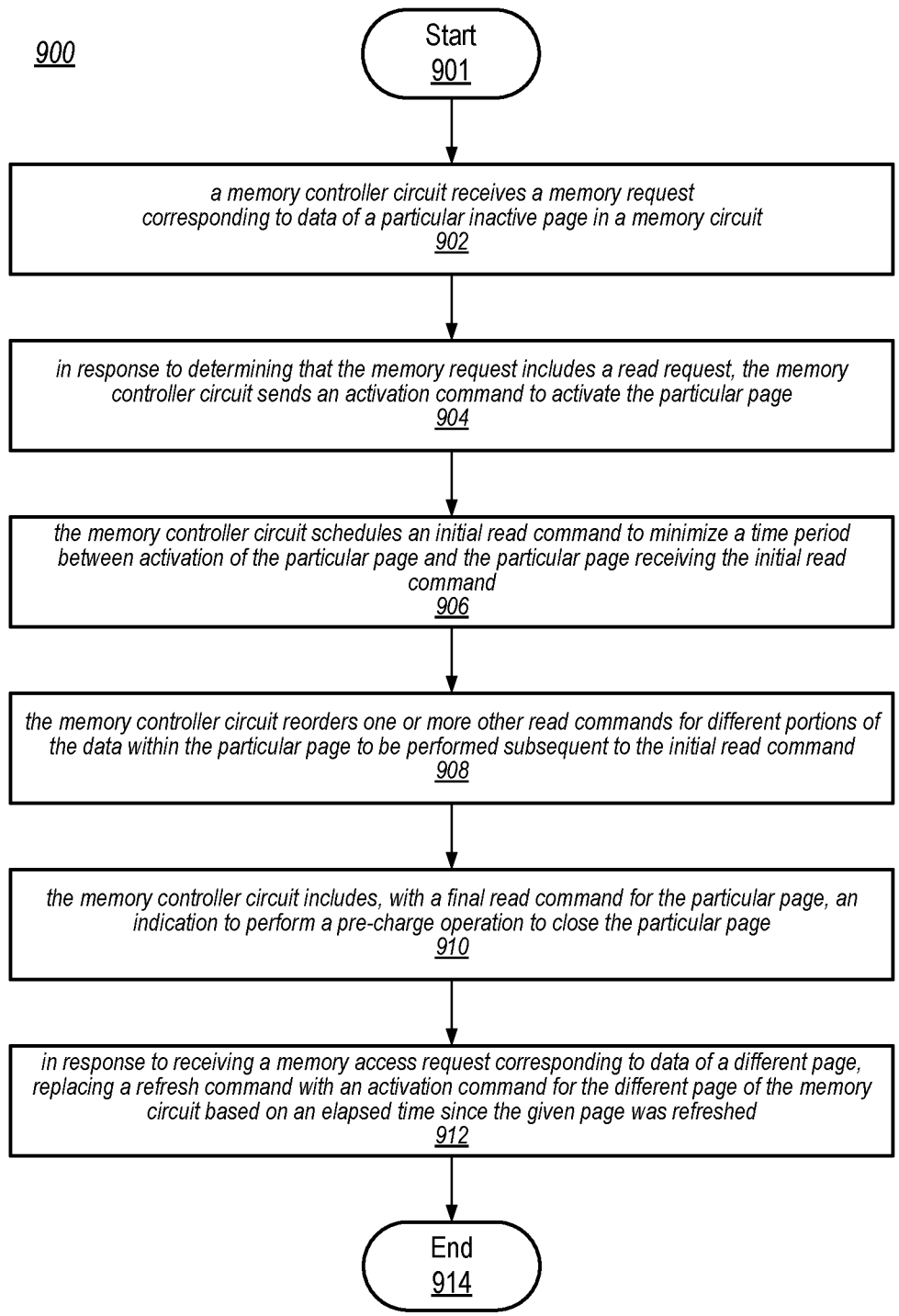
FIG. 9 illustrates a flow diagram of an embodiment of a method performed by a memory controller circuit for activating a page of a memory circuit and scheduling a plurality of read memory requests.

Proceeding to FIG. 9, a flow diagram illustrating an embodiment of a method for determining and utilizing an efficiency value by a memory controller is shown. Method 900, similar to method 800 above, may be applied to a memory controller circuit, such as, e.g., memory controller circuit 110 in FIG. 1 or memory controller circuit 210 in FIGS. 2A and 2B. The operations disclosed by method 900 may be performed in combination with or as a part of method 800. Referring collectively to FIGS. 2A and 2B, and the flow diagram of FIG. 9, the method may begin in block 901.

A memory controller circuit receives a memory request corresponding to data of a particular inactive page in a memory circuit (block 902). Memory controller circuit 210, for example, receives memory access request 230 that includes an address value that corresponds to a memory page 1 of the memory circuit. Control circuit 215 of memory controller circuit 210 determines that memory page 1 is currently inactive.

In response to determining that the memory request includes a read request, the memory controller circuit sends an activation command to activate the particular page (block 904). Control circuit 215 may decode memory access request 230, and thereby determine that memory access request 230 includes a request to read data from memory page 1 of the memory circuit. Having determined that memory page 1 is currently inactive, control circuit 215 schedules, in command buffer 250, activation command A(p1) 240 to be sent to the memory circuit to activate page 1.

The memory controller circuit schedules an initial read command to minimize a time period between activation of the particular page and the particular page receiving the initial read command (block 906). Based on a page activation time that corresponds to an amount of time from time t0 to time t1 of chart 200, control circuit 215 schedules initial read command R(p1) 241 in command buffer 250. The placement of initial read command R(p1) 241 within command buffer 250 determines a timing for read command 241 to be sent to the memory circuit.

The memory controller circuit reorders one or more other read commands for different portions of the data within the particular page to be performed subsequent to the initial read command (block 908). Following initial read command R(p1) 241, additional read commands to memory page 1 may be scheduled. As shown, control circuit 215 schedules read command R(p1) 242 in command buffer 250 subsequent to read command R(p1) 241. In various embodiments, read command R(p1) 242 may correspond to memory access request 230, may be related to a different read request and have been previously scheduled for a later execution time, or may be related to a subsequently received memory request and be initially scheduled following read command R(p1) 241.

The memory controller circuit includes, with a final read command for the particular page, an indication to perform a pre-charge operation to close the particular page (block 910). Read command R(p1) 242 may be a final read command for memory page 1 corresponding to the current page activation. If no other read commands for memory page 1 are currently scheduled in command buffer 250, then control circuit 215 includes an indication with command R(p1) 242 to perform a pre-charge operation to close page 1, thereby returning memory page 1 to an inactive state.

In response to receiving a memory access request corresponding to data of a different page, replacing a refresh command with an activation command for the different page of the memory circuit based on an elapsed time since the given page was refreshed (block 912). While scheduling and sending commands to activate and read memory page 1, memory controller circuit 210 may schedule a refresh command for a different memory page before a refresh time for that memory page elapses. If a memory request is received for data corresponding to the other memory page, then control circuit 215 may replace the refresh command with a different command for the other page, such as, for example, a page activation command. The method ends in block 914.

It is noted that method 900 is an example technique for scheduling memory commands to fulfill a memory request. Operations may be performed in a different order in other embodiments. For example, in some embodiments, operations of block 912 may occur concurrently or before operations of block 910. Some embodiments may include additional operations, such as, for example, an addition operation to receive other memory requests may be included in method 900.

Figure 10:
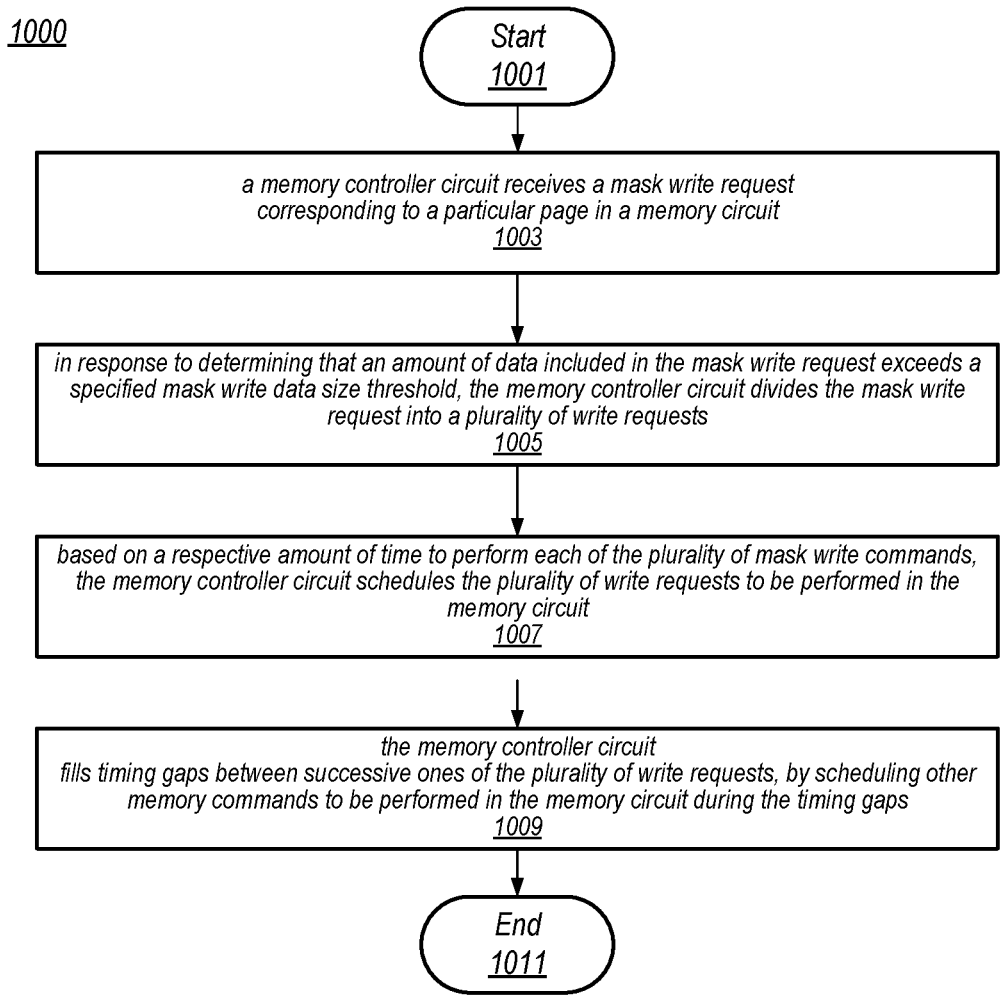
FIG. 10 shows a flow diagram of an embodiment of a method for scheduling, by a memory controller circuit, a mask write memory request.

Moving now to FIG. 10, a flow diagram illustrating an embodiment of a method for scheduling memory commands in response to receiving a mask write request is depicted. Method 1000, may be applied to any of the memory controller circuits disclosed herein, such as, e.g., memory controller circuit 610 in FIG. 6. The operations disclosed by method 1000 may be performed in conjunction with methods 800 and/or 900 in FIGS. 8 and 9, respectively. Referring collectively to FIGS. 6, 7, and the flow diagram of FIG. 10, the method begins in block 1001.

A memory controller circuit receives a mask write request corresponding to a particular page in a memory circuit (block 1003). As illustrated, the memory controller circuit (e.g., memory controller circuit 610) receives mask write memory request 630. Mask write memory request 630 may include one or more addresses for memory locations in page 625b of memory circuit 620. As previously disclosed, a mask write request corresponds to a memory request in which a portion of data at one or more addresses in a particular memory page is to be masked to prevent writing over previously stored data at locations corresponding to the one or more addresses.

In response to determining that an amount of data included in the mask write request exceeds a specified mask write data size threshold, the memory controller circuit divides the mask write request into a plurality of write requests (block 1005). In the illustrated embodiment, a mask write command is limited to a specified mask write data size threshold. This mask write data size threshold may limit a single mask write command to writing to a range of, for example, 32 or 64 bytes within a memory page that is larger than 64 bytes. A memory page may include, for example, 512 or 1024 bytes of data in some embodiments. Control circuit 615 in memory controller circuit 610 determines that mask write memory request 630 addresses a range of memory locations that exceeds the mask write data size threshold and, therefore, divides request 630 into a plurality of mask write commands, W(p2) 640-642. Each of the three mask write commands W(p2) 640-642 addresses a range of memory locations that is less than the specified mask write data size limit.

Based on a respective amount of time to perform each of the plurality of mask write commands, the memory controller circuit schedules the plurality of write requests to be performed in the memory circuit (block 1007). As shown, control circuit 615 determines an amount of time to perform each of mask write commands W(p2) 640-642. Using these determined amounts of time, control circuit 615 schedules each of write commands W(p2) 640-642 in command buffer 650.

The memory controller circuit fills timing gaps between successive ones of the plurality of write requests, by scheduling other memory commands to be performed in the memory circuit during the timing gaps (block 1009). Referring now to FIG. 7, mask write commands W(p1) 740-742 have been scheduled, at time t1, in command buffer 750, based on mask write times 745 and 746. The scheduled times leave timing gap 754 between mask write commands 740 and 741, as well as timing gap 755 between mask write commands 741 and 742. To avoid wasting time that could be otherwise utilized, control circuit 615 schedules, at time t2, other memory commands to fill timing gaps 754 and 755. As illustrated, control circuit 615 schedules two activation commands, A(p2)760 and A(p3) 770, during timing gap 754. Control circuit 615 further schedules two read commands, R(p2) 761 and R(p3) 771, and another activation command, A(p4) 780, during timing gap 755. The method ends in block 1011.

It is noted that method 1000 is an embodiment related to processing mask write memory requests. Additional operations may be included in some embodiments. For example, an additional operation may be included to receive another memory request before block 1009 in some embodiments.

The systems and methods presented and described above may be included in and performed by a computing system. An example of such a computing system is described below.

Figure 11:
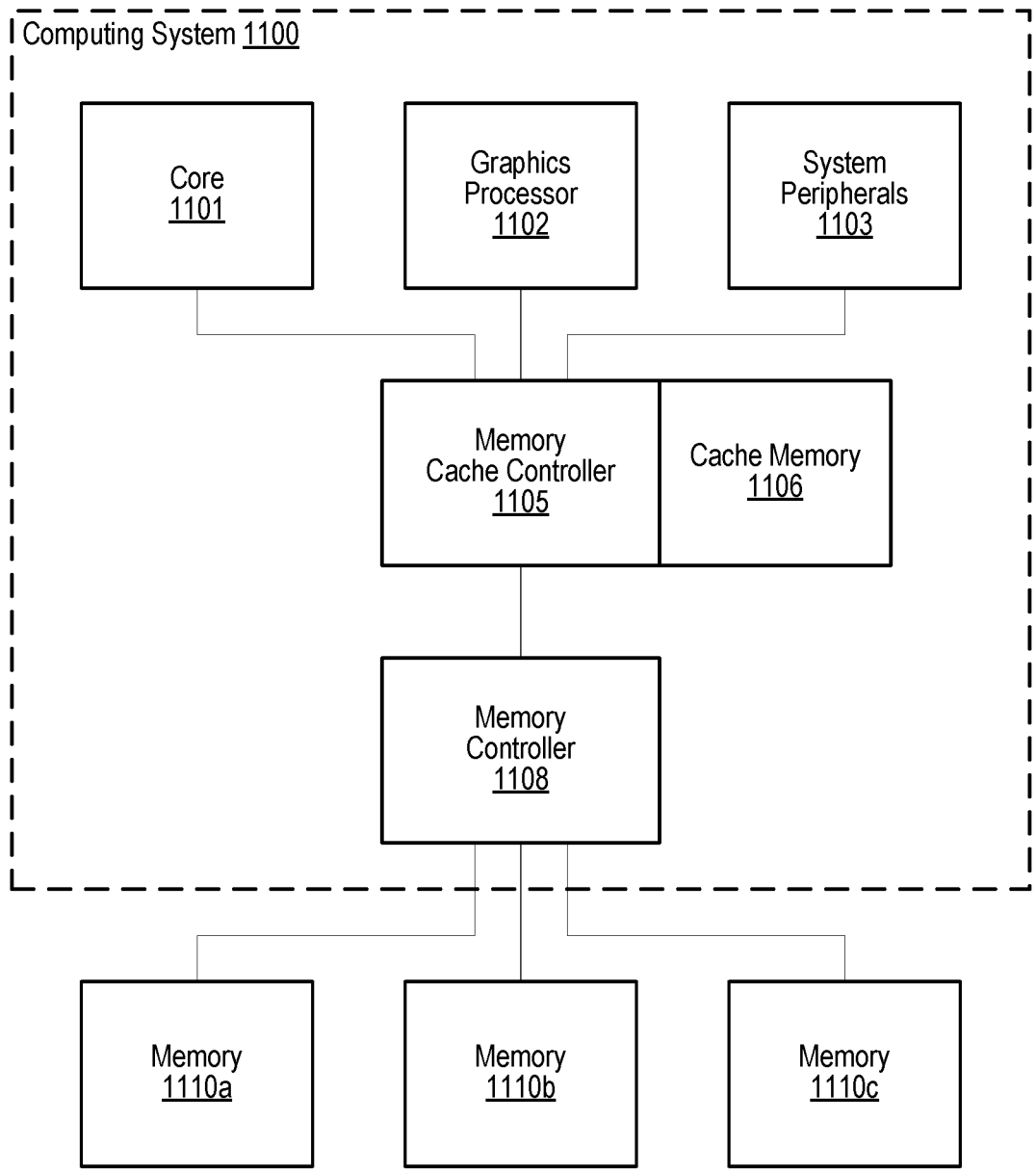
FIG. 11 depicts a block diagram of an embodiment of a computer system.

A block diagram of an embodiment of a computer system, such as, for example, a system-on-chip (SoC), is illustrated in FIG. 11. Computer system 1100 may be representative of a system that includes a memory controller circuit and memory circuit, and that utilizes the concepts disclosed above. Computer system 1100, in various embodiments, may be a system implemented on one or more circuit boards, including a plurality of integrated circuits, or may be an SoC integrated onto a single computer chip, or may be implemented as a combination thereof. Computer system 1100 includes several processing cores, including core 1101, graphics processor 1102, and system peripherals 1103, all coupled to memory cache controller 1105. Memory cache controller 1105 is coupled to cache memory 1106 and to memory controller circuit 1108. Memory controller circuit 1108 is coupled to memories 1110a-1110c. Collectively, memory controller circuit 1108 and memories 1110a-1110c form memory system 820, which, in some embodiments, corresponds to memory system 100 in FIG. 1.

In the illustrated embodiments, core 1101 is representative of a general-purpose processing core that performs computational operations. Although a single processing core, i.e., core 1101, is illustrated, in some embodiments core 1101 may correspond to a core complex that includes any suitable number of processing cores. In various embodiments, core 1101 may implement any suitable instruction set architecture (ISA), such as, e.g., ARM™, PowerPC®, Blackfin, or x86 ISAs, or combination thereof. Core 1101 may execute instructions and utilize data stored in memories located outside of computer system 1100, such as, for example, memories 1110a-1110c, by issuing memory transactions to fetch the instructions and data to be utilized. Data and instructions fetched from memories 1110a-1110c may be cached in cache memory 1106. In some embodiments, core 1101 may include one or more cache memories in addition to cache memory 1106.

Graphics processor 1102, in the illustrated embodiment, includes circuitry for processing images or video to be sent to a display screen (not shown). In some embodiments, images and/or videos to be processed by graphics processor 1102 may be stored in memories 1110a-1110c. Memories 1110a-1110c may also store graphics processing instructions for use by graphics processor 1102 to generate the images. Graphics processor 1102 may correspond to a processing core capable of issuing memory transactions to retrieve graphics data and instructions. Data retrieved from memories 1110a-1110c may be cached in cache memory 1106.

In the illustrated embodiment, system peripherals 1103 includes one or more circuit blocks for performing any number of suitable tasks. For example, in various embodiments, system peripherals 1103 may include any one or more of communication peripherals (e.g., universal serial bus (USB), Ethernet), encryption engines, audio processors, direct memory access modules, or any other peripheral that may generate memory transactions to retrieve data or commands from memories 1110a-1110c. System peripherals 1103 may include one or more processing cores within the various functional circuits that are capable of issuing memory transactions to memory cache controller 1105.

In the illustrated embodiment, memory cache controller 1105 includes circuits for managing memory transactions issued by core 1101, graphics processor 1102, and system peripherals 1103. In the illustrated embodiment, memory cache controller 1105 decodes memory transactions, translates addresses, and determines if valid content corresponding to the addressed location is currently in cache memory 1106, or if this data is to be fetched from memories 1110a-1110c or elsewhere. If valid content is not currently cached in cache memory 1106, then memory cache controller 1105 may send the transaction to memory controller circuit 1108 to fetch the requested data. In some embodiments, computer system 1100 may include more than one cache memory 1106 and may, therefore, include a respective memory cache controller 1105 for each cache memory 1106.

In some embodiments, memory controller circuit 1108 may, correspond to any of the memory controller circuits described herein, such as, for example, memory controller circuit 110 in FIG. 1. Memory controller circuit 1108 may include one or more memory controller circuits for fulfilling memory transactions from each of memories 1110a-1110c. For example, one memory controller circuit may be included for each of memories 1110a-1110c. In the illustrated embodiment, memory controller circuit 1108 includes circuits used to read and write data to each of memories 1110a-1110c. Memory controller circuit 1108 receives memory transactions from memory cache controller 1105 if valid content corresponding to the transaction's address is not currently stored in cache memory 1106.

In some embodiments, memories 1110a-1110c may correspond to one or more of the memory circuits described herein. For example, in some embodiments, each of memories 1110a-1110c may correspond to respective memory circuits 120. In other embodiments, memories 1110a-1110c may correspond to a single memory circuit 120. Memories 1110a-1110c are storage devices that collectively form at least a portion of memory hierarchy that stores data and instructions for computer system 1100. More particularly, memories 1110a-1110c may correspond to volatile memory with access times less than a non-volatile memory device. Memories 1110a-1110c may therefore be used to store instructions and data corresponding to an operating system and one or more applications read from a non-volatile memory after a system boot of computer system 1100. Memories 1110a-1110c may be representative of memory devices in the dynamic random access memory (DRAM) family of memory devices or in the static random access memory (SRAM) family of memory devices, or in some embodiments, a combination thereof.

It is also noted that, to improve clarity and to aid in demonstrating the disclosed concepts, the diagram of computer system 1100 illustrated in FIG. 11 has been simplified. In other embodiments, different and/or additional circuit blocks and different configurations of the circuit blocks are possible and contemplated.

Figure 12:
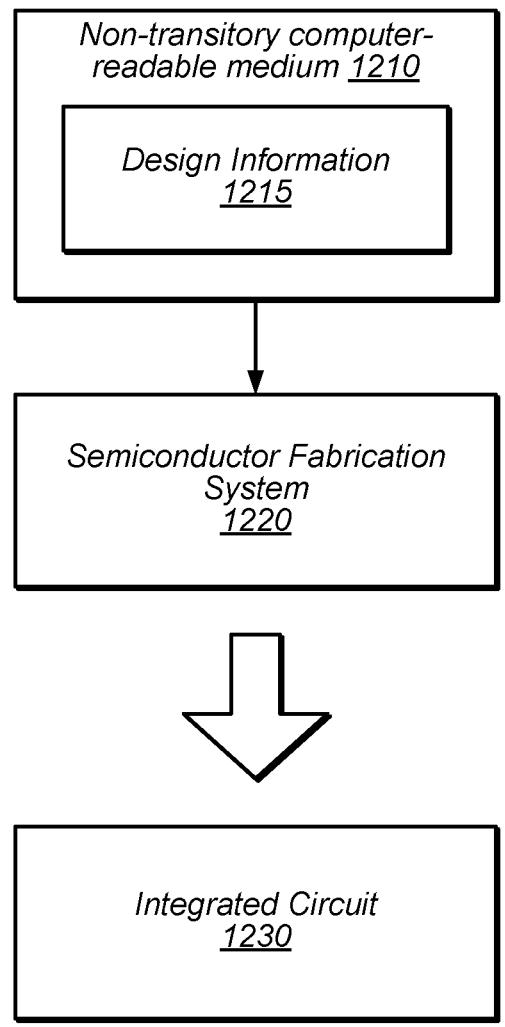
FIG. 12 illustrates a block diagram depicting an example computer-readable medium, according to some embodiments.

FIG. 12 is a block diagram illustrating an example of a non-transitory computer-readable storage medium that stores circuit design information, according to some embodiments. The embodiment of FIG. 12 may be utilized in a process to design and manufacture integrated circuits, such as, for example, an IC that includes computer system 1100 of FIG. 11. In the illustrated embodiment, semiconductor fabrication system 1220 is configured to process the design information 1215 stored on non-transitory computer-readable storage medium 1210 and fabricate integrated circuit 1230 based on the design information 1215.

Non-transitory computer-readable storage medium 1210, may comprise any of various appropriate types of memory devices or storage devices. Non-transitory computer-readable storage medium 1210 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 1210 may include other types of non-transitory memory as well or combinations thereof. Non-transitory computer-readable storage medium 1210 may include two or more memory mediums which may reside in different locations, e.g., in different computer systems that are connected over a network.

Design information 1215 may be specified using any of various appropriate computer languages, including hardware description languages such as, without limitation:

VHDL, Verilog, SystemC, SystemVerilog, RHDL, M, MyHDL, etc. Design information 1215 may be usable by semiconductor fabrication system 1220 to fabricate at least a portion of integrated circuit 1230. The format of design information 1215 may be recognized by at least one semiconductor fabrication system, such as semiconductor fabrication system 1220, for example. In some embodiments, design information 1215 may include a netlist that specifies elements of a cell library, as well as their connectivity. One or more cell libraries used during logic synthesis of circuits included in integrated circuit 1230 may also be included in design information 1215. Such cell libraries may include information indicative of device or transistor level netlists, mask design data, characterization data, and the like, of cells included in the cell library.

Integrated circuit 1230 may, in various embodiments, include one or more custom macrocells, such as memories, analog or mixed-signal circuits, and the like. In such cases, design information 1215 may include information related to included macrocells. Such information may include, without limitation, schematics capture database, mask design data, behavioral models, and device or transistor level netlists. As used herein, mask design data may be formatted according to graphic data system (gdsii), or any other suitable format.

Semiconductor fabrication system 1220 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1220 may also be configured to perform various testing of fabricated circuits for correct operation.

In various embodiments, integrated circuit 1230 is configured to operate according to a circuit design specified by design information 1215, which may include performing any of the functionality described herein. For example, integrated circuit 1230 may include any of various elements shown or described herein. Further, integrated circuit 1230 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a memory circuit including a plurality of pages, including a particular page having a page activation time;
   a memory controller circuit configured to:
      receive a memory access request corresponding to data of the particular page;
      transmit, in response to a determination that the particular page is inactive, an activation command to the memory circuit to activate the particular page;
      schedule a future transmission of one or more read commands, including an initial read command, for the particular page based on the page activation time;
      include, with a final read command of the one or more read commands, an indication to perform a pre-charge operation to close the particular page; and
      schedule a refresh command for the particular page to be transmitted after the initial read command is transmitted and before a period of time elapses from performance of the pre-charge operation.

2. The apparatus of claim 1, wherein the memory controller circuit is configured to schedule the initial read command to reduce a delay between when the particular page activates in response to the activation command and when the particular page receives the initial read command.

3. The apparatus of claim 1, wherein the memory controller circuit is further configured to schedule the one or more read commands for different portions of the data within the particular page.

4. The apparatus of claim 1, wherein the memory controller circuit is further configured to, before the refresh command is transmitted and in response to receiving a different memory access request corresponding to data of the particular page, replace the refresh command with a different activation command to the memory circuit to activate the particular page.

5. The apparatus of claim 1, wherein the memory access request is a write request that includes a read operation followed by a write operation, wherein the read operation includes the one or more read commands, and wherein the memory controller circuit is further configured to schedule the initial read command to reduce a delay between when the particular page activates in response to the activation command and when the particular page receives the initial read command.

6. The apparatus of claim 1, wherein to schedule the future transmission of the one or more read commands for the particular page based on the page activation time, the memory controller circuit is further configured to, based on the page activation time, place the initial read command into a command buffer, wherein a placement of the initial read command within the command buffer determines when the initial read command is sent to the memory circuit.

7. The apparatus of claim 1, wherein the memory circuit is a dynamic random-access memory (DRAM) circuit, and wherein the page activation time includes an amount of time for the DRAM circuit to retrieve data from memory cells and copy the retrieved data to a page buffer.

8. The apparatus of claim 1, wherein the memory access request includes a mask write request, and wherein the memory controller circuit is further configured to:

in response to a determination that a portion of data included in the mask write request exceeds a mask write size threshold:

split the mask write request into a plurality of write requests each specifying a corresponding amount of data that is less than the mask write size threshold; and schedule transmission of the plurality of write requests to the memory circuit.

9. The apparatus of claim 8, wherein the memory controller circuit includes a buffer configured to store memory access commands, and wherein the memory controller circuit is further configured to schedule memory access commands stored in the buffer for transmission to the memory circuit to fill timing gaps between successive ones of the plurality of write requests.

10. A method, comprising:

receiving, by a memory controller circuit, a memory request corresponding to data of a particular page in a memory circuit;

in response to determining that the particular page is inactive, sending, by the memory controller circuit, an activation command to the memory circuit to activate the particular page;

based on a page activation time, placing, by the memory controller circuit into a command buffer, one or more read commands to access the particular page, wherein placement of a particular read command determines when the particular read command for the particular page is sent to the memory circuit;

including, by the memory controller circuit with a final read command of the one or more read commands, an indication to perform a pre-charge operation to close the particular page; and placing, by the memory controller circuit into the command buffer, a refresh command for the particular page to be sent a period of time after the pre-charge operation.

11. The method of claim 10, further comprising scheduling an initial read command of the one or more read commands to reduce a time period between activation of the particular page and the particular page receiving the initial read command.

12. The method of claim 10, further comprising reordering a subset of the one or more read commands for different portions of the data within the particular page to be performed subsequent to an initial one of the one or more read commands.

13. The method of claim 12, further comprising, before the refresh command is sent and responsive to receiving a different memory request corresponding to data of the particular page, replacing the refresh command with a different activation command to activate the particular page.

14. The method of claim 10, wherein the memory request is a read-modify-write operation, and further comprising scheduling an initial read command to reduce a time period between activation of the particular page and the particular page receiving the initial read command.

15. The method of claim 10, wherein the memory request includes a mask write request, and further comprising:

in response to determining that an amount of data included in the mask write request exceeds a specified mask write data size threshold, dividing the mask write request into a plurality of write requests that do not exceed the specified mask write data size threshold; and scheduling the plurality of write requests to be performed in the memory circuit.

16. The method of claim 15, further comprising, to fill timing gaps between successive ones of the plurality of write requests, scheduling other memory commands to be performed in the memory circuit during the timing gaps.

17. An apparatus, comprising:

a memory circuit including a plurality of pages;

a memory controller circuit configured to:

receive a mask write memory request for a particular page of the plurality of pages;

generate a plurality of write commands in response to a determination that the mask write memory request includes more than a specified mask write data size threshold amount of data;

determine a respective amount of time to perform each of the plurality of write commands; and schedule a future transmission of each of the plurality of write commands based on the respective amounts of time.

18. The apparatus of claim 17, wherein the memory controller circuit is further configured to:

receive a read request for data located in a different page; and in response to a determination that the different page is inactive, schedule a future transmission of an activation command between two of the plurality of write commands to fill a timing gap between the two write commands.

19. The apparatus of claim 18, wherein the memory controller circuit is further configured to schedule a future transmission of an initial read command for the different page based on a page activation time for the different page.

20. The apparatus of claim 17, further comprising a buffer configured to store memory commands for future transmission, wherein the memory controller circuit is configured to, arrange other memory commands between at least two of the plurality of write commands to fill timing gaps between successive ones of the plurality of write commands.

* * * * *